United States Patent
Kim et al.

(10) Patent No.: US 9,722,002 B2
(45) Date of Patent: Aug. 1, 2017

(54) ORGANIC LIGHT-EMITTING DIODE DISPLAY

(71) Applicant: Samsung Display Co., Ltd., Yongin-si, Gyeonggi-do (KR)

(72) Inventors: Kwang-Min Kim, Seoul (KR); Byoung-Sun Kim, Hwaseong-si (KR); Hyun-Ae Park, Cheonan-si (KR); Hye-Jin Shin, Cheonan-si (KR)

(73) Assignee: Samsung Display Co., Ltd., Gyeonggi-do (KR)

( * ) Notice: Subject to any disclaimer, the term of this patent is extended or adjusted under 35 U.S.C. 154(b) by 10 days.

(21) Appl. No.: 14/861,927

(22) Filed: Sep. 22, 2015

(65) Prior Publication Data
US 2016/0240595 A1    Aug. 18, 2016

(30) Foreign Application Priority Data
Feb. 17, 2015    (KR) .................. 10-2015-0023815

(51) Int. Cl.
*H01L 27/32*    (2006.01)

(52) U.S. Cl.
CPC ...... *H01L 27/3223* (2013.01); *H01L 27/3211* (2013.01)

(58) Field of Classification Search
CPC ............. H01L 51/0545; H01L 51/0036; H01L 51/0541; H01L 51/5012
See application file for complete search history.

(56) References Cited

U.S. PATENT DOCUMENTS

| | | | |
|---|---|---|---|
| 7,619,288 B2* | 11/2009 | Hotta ............... | G09G 3/006 257/342 |
| 8,331,713 B2* | 12/2012 | Shiraki ............. | G06T 5/003 348/345 |
| 8,853,701 B2* | 10/2014 | Hotta ............... | H01L 27/1214 257/59 |
| 2012/0327064 A1 | 12/2012 | Qi et al. | |

FOREIGN PATENT DOCUMENTS

| | | |
|---|---|---|
| KR | 10-2004-0110019 A | 12/2004 |
| KR | 10-2010-0009213 A | 1/2010 |
| KR | 10-2012-0004119 A | 1/2012 |

* cited by examiner

*Primary Examiner* — Quoc Hoang
(74) *Attorney, Agent, or Firm* — Knobbe Martens Olson & Bear LLP (57) ABSTRACT

An organic light-emitting diode (OLED) display is disclosed. In one aspect, the OLED display includes a substrate including a pixel region including a plurality of pixels. A plurality of lighting test transistors is formed in a peripheral region surrounding the pixel region and electrically connected to the pixels, and the lighting test transistors are configured to test lighting of the pixels. Each of the lighting test transistors includes a first active layer pattern formed over the substrate, a first gate electrode formed over the first active layer pattern, and a conductive pattern formed over the first gate electrodes. The conductive pattern is electrically connected to the first gate electrode, the first gate electrodes are spaced apart from each other and have substantially the same shape, and the conductive patterns are integrally formed.

20 Claims, 8 Drawing Sheets

ORGANIC LIGHT-EMITTING DIODE DISPLAY

INCORPORATION BY REFERENCE TO ANY PRIORITY APPLICATIONS

This application claims priority under 35 USC §119 to Korean Patent Applications No. 10-2015-0023815, filed on Feb. 17, 2015 in the Korean Intellectual Property Office (KIPO), the contents of which are incorporated herein in its entirety by reference.

BACKGROUND

Field

The described technology generally relates to organic light-emitting diode displays Description of the Related Technology Flat panel displays (FPDs) are widely used in electronic devices because they are lightweight and thin compared to cathode-ray tube (CRT) displays. Typical examples include liquid crystal displays (LCDs) and organic light-emitting diode (OLED) displays. Compared to the LCDs, the OLED technology has many favorable characteristics such as higher luminance and wider viewing angles. In addition, the OLED display can be made thinner because it does not require a backlight. In OLEDs, electrons and holes are injected into an organic thin layer through a cathode and an anode, and then recombined in the organic thin layer to generate excitons, thereby light of a certain wavelength can be emitted.

SUMMARY OF CERTAIN INVENTIVE ASPECTS

One inventive aspect relates to an OLED display including lighting test transistors having gate electrodes that have the same shape to each other.

Another aspect is an OLED display that includes a substrate and a plurality of lighting test transistors. The substrate has a pixel region in which a plurality of pixels is arranged. The lighting test transistors are formed in a peripheral region on the substrate, and electrically connected to the pixels. The lighting test transistors perform a lighting test of the pixels, and the peripheral region surrounds the pixel region. Each of the lighting test transistors includes a first active layer pattern, first gate electrode, and a conductive pattern. The first active layer pattern is formed on the substrate. The first gate electrode is formed on the first active layer pattern. The conductive pattern is formed on the first gate electrodes, and the conductive pattern is electrically connected to the first gate electrode. The first gate electrodes are spaced apart from each other, and have the same shape to each other. The conductive patterns are integrally formed.

In example embodiments, each of the pixels includes a semiconductor element, a lower electrode, a light-emitting layer, and an upper electrode. The semiconductor element can be formed on the substrate. The lower electrode can be formed on the semiconductor element. The light-emitting layer can be formed on the lower electrode. The upper electrode can be formed on the light-emitting layer.

In example embodiments, the semiconductor element includes a second active layer pattern, a second gate electrode, a source electrode, and a drain electrode. The second active layer pattern can be formed on the substrate. The second gate electrode can be formed on the second active layer pattern. The source electrode can be in contact with a source region of the second active layer pattern. The drain electrode can be in contact with a drain region of the second active layer pattern.

In example embodiments, the OLED display further includes a gate insulation layer and an insulating interlayer. The gate insulation layer can be formed on the substrate, the first active layer pattern, and the second active layer pattern. The insulating interlayer can be formed on the gate insulation layer, the first gate electrode, and the second gate electrode. The insulating interlayer can have an opening that exposes at least a portion the first gate electrode, and the conductive pattern can be contacted with the first gate electrode through the opening.

In example embodiments, the OLED display can further include a first electrode and a second electrode. The first electrode can be formed on the insulating interlayer, and can be in contact with a source region of the first active layer pattern. The second electrode can be formed on the insulating interlayer, and can be in contact with a drain region of the first active layer pattern. A light-emitting signal can be provided to the first electrode, and a gate signal of the lighting test transistor can be provided to the conductive pattern.

In example embodiments, the first gate electrode and the second gate electrode are simultaneously formed using the same materials, and the first active layer pattern and the second active layer pattern are simultaneously formed using the same materials.

In example embodiments, the pixel region and the peripheral region are a planar shape of a circle, an ellipse, or a track-shape.

In example embodiments, the pixel region includes a first region and a second region that is opposite to the first region. The first region and the second region can have a planar shape of a half circle, and an arrangement of the pixels can be symmetric to each other with respect to a boundary of the first region and the second region.

In example embodiments, the lighting test transistors are formed in the peripheral region adjacent to the first region.

In example embodiments, the conductive pattern has a stepped structure in the peripheral region adjacent to the first region.

In example embodiments, the stepped structure includes a first extension portion and a second extension portion. The first extension portion can be in paralleled to a first direction. The second extension portion can extend in a second direction that is perpendicular to the first direction. The first extension portion and the second extension portion can be alternately and repeatedly formed in the peripheral region adjacent to the first region, and the first gate electrode can be formed in a portion under which the second extension portion is located.

In example embodiments, the second extension portion is electrically connected to the first gate electrode.

In example embodiments, the pixel region includes first through (N)th pixel columns, where K is an integer greater than 1, and the pixels can be arranged along each of the pixel columns.

In example embodiments, the pixel region includes a center pixel column that is located between the first pixel column and (N)th pixel column, and the number of the pixels is increased in a direction from the first and (N)th pixel columns to the center pixel column that is located in the center of the pixel region.

In example embodiments, the center pixel column has the maximum number of the pixels, and the first and (N)th pixel column has the minimum number of the pixels, where the minimum number of the pixel is an integer greater than 2.

In example embodiments, pixel columns that are located adjacent to the center pixel column have the maximum number of the pixels.

In example embodiments, the lighting test transistors include first through (N)th light test transistors, and each of the first through (N)th light test transistors is coupled to the first through (N)th pixel columns, respectively.

In example embodiments, when the (K)th lighting test transistor is turned-on, the pixels that are arranged in the (K)th pixel column are turned-on, where K is an integer between 1 and N.

In example embodiments, one pixel includes first through third sub-pixels, and one lighting test transistor includes first through third sub-lighting test transistors.

In example embodiments, each of the first through third sub-lighting test transistors is coupled to the first through third sub-pixels, respectively.

Another aspect is an organic light-emitting diode (OLED) display, comprising: a substrate including a pixel region including a plurality of pixels; and a plurality of lighting test transistors formed in a peripheral region surrounding the pixel region and electrically connected to the pixels, wherein the lighting test transistors are configured to test lighting of the pixels. Each of the lighting test transistors includes: a first active layer pattern formed over the substrate; a first gate electrode formed over the first active layer pattern; and a conductive pattern formed over the first gate electrodes, wherein the conductive pattern is electrically connected to the first gate electrode. The first gate electrodes are spaced apart from each other and have substantially the same shape. The conductive patterns are integrally formed.

In the above OLED display, each of the pixels includes: a semiconductor element formed over the substrate; a lower electrode formed over the semiconductor element; a light-emitting layer formed over the lower electrode; and an upper electrode formed over the light-emitting layer.

In the above OLED display, the semiconductor element includes: a second active layer pattern formed over the substrate and including source and drain regions; a second gate electrode formed over the second active layer pattern; a source electrode contacting the source region of the second active layer pattern; and a drain electrode contacting the drain region of the second active layer pattern.

The above OLED display further comprises: a gate insulation layer formed over the substrate, the first active layer pattern, and the second active layer pattern; and an insulating interlayer formed over the gate insulation layer, the first gate electrode, and the second gate electrode, wherein the insulating interlayer has an opening that exposes at least a portion of the first gate electrode, and wherein the conductive pattern contacts the first gate electrode via the opening.

In the above OLED display, the first active pattern includes source and drain regions, wherein the OLED display further comprises: a first electrode formed over the insulating interlayer and contacting the source region of the first active layer pattern; and a second electrode formed over the insulating interlayer and contacting the drain region of the first active layer pattern, wherein the first electrode is configured to receive a light-emitting signal, and wherein the lighting test transistor is configured to provide a gate signal to the conductive pattern.

In the above OLED display, the first and second gate electrodes are formed of the same material, and wherein the first and second active layer patterns are formed of the same material.

In the above OLED display, the pixel region and the peripheral region are substantially circular, are substantially elliptical, or have a track-shape.

In the above OLED display, the pixel region includes first and second regions opposing each other, wherein the first and second regions have the shape of substantially a semi-circle, and wherein the pixels include a first group of pixels and a second group of pixels, and wherein the first and second groups are symmetrical to each other with respect to a boundary between the first and second regions.

In the above OLED display, the lighting test transistors are formed in the peripheral region adjacent to the first region.

In the above OLED display, the conductive pattern has a step shape in the peripheral region.

In the above OLED display, the step shape includes: a first extension portion formed in a first direction; and a second extension portion extending in a second direction crossing the first direction, wherein the first and second extension portions are alternately and repeatedly formed in the peripheral region, and wherein the first gate electrode is formed below the second extension portion.

In the above OLED display, the second extension portion is electrically connected to the first gate electrode.

In the above OLED display, the pixel region includes a plurality of pixel columns including first to (N)th pixel columns, where N is an integer greater than 1, and wherein the pixels are formed in the pixel columns.

In the above OLED display, the pixel region includes a center pixel column located between the first pixel column and the (N)th pixel column, wherein the number of the pixels increases from the first to the center pixel column located in the center of the pixel region, and wherein the number of the pixels increases from the (N)th pixel columns to the center pixel column.

In the above OLED display, the center pixel column has the maximum number of the pixels among all of the pixel columns, wherein each of the first and (N)th pixel columns has the minimum number of the pixels among all of the pixel columns, where the minimum number is an integer greater than 2.

In the above OLED display, one or more of the pixel columns located adjacent to the center pixel column have the maximum number of the pixels.

In the above OLED display, the lighting test transistors include first to (N)th lighting test transistors, wherein the first to (N)th light test transistors are electrically connected to the first to (N)th pixel columns, respectively.

In the above OLED display, the pixels of the (K)th column are configured to be turned on when a (K)th lighting test transistor is on, where K is an integer between 1 and N.

In the above OLED display, each of the pixels includes first to third sub-pixels, wherein each of the lighting test transistors includes first to third sub-lighting test transistors.

In the above OLED display, the first to third sub-lighting test transistors are electrically connected to the first to third sub-pixels, respectively.

According to at least one of the disclosed embodiments, the OLED display includes lighting test transistors having gate electrodes that have substantially the same shape as each other, and thus, the uniformity of the luminance and accuracy of the lighting test can be increased.

DETAILED DESCRIPTION OF CERTAIN INVENTIVE EMBODIMENTS

Recently, OLED displays having a circular structure are being developed. The shape of the OLED display can have a planar shape of a circle or an ellipse. After manufacturing, a lighting test of the OLED display can be performed. For example, the lighting test circuit can be positioned in an outer portion of the OLED display, and the lighting test can be performed through the lighting test circuit. In this case, each of a plurality of the lighting test transistors can be coupled to each of a plurality of pixel columns in the lighting test circuit. In addition, a gate electrode of the lighting test transistor can be shared by (e.g., electrically connected to) the light test transistor. Here, brightness and accuracy of the two side portions of the display device may not be identical with that of the center portion of the display device due to an antenna ratio of the gate electrode. That is, uniformity of brightness and accuracy for the lighting test of the display device may be reduced. As a result, the lighting test may not be properly performed.

Hereinafter, embodiments of the described technology will be explained in detail with reference to the accompanying drawings. In this disclosure, the term "substantially" includes the meanings of completely, almost completely or to any significant degree under some applications and in accordance with those skilled in the art. Moreover, "formed on" can also mean "formed over." The term "connected" can include an electrical connection.

Figure 1:
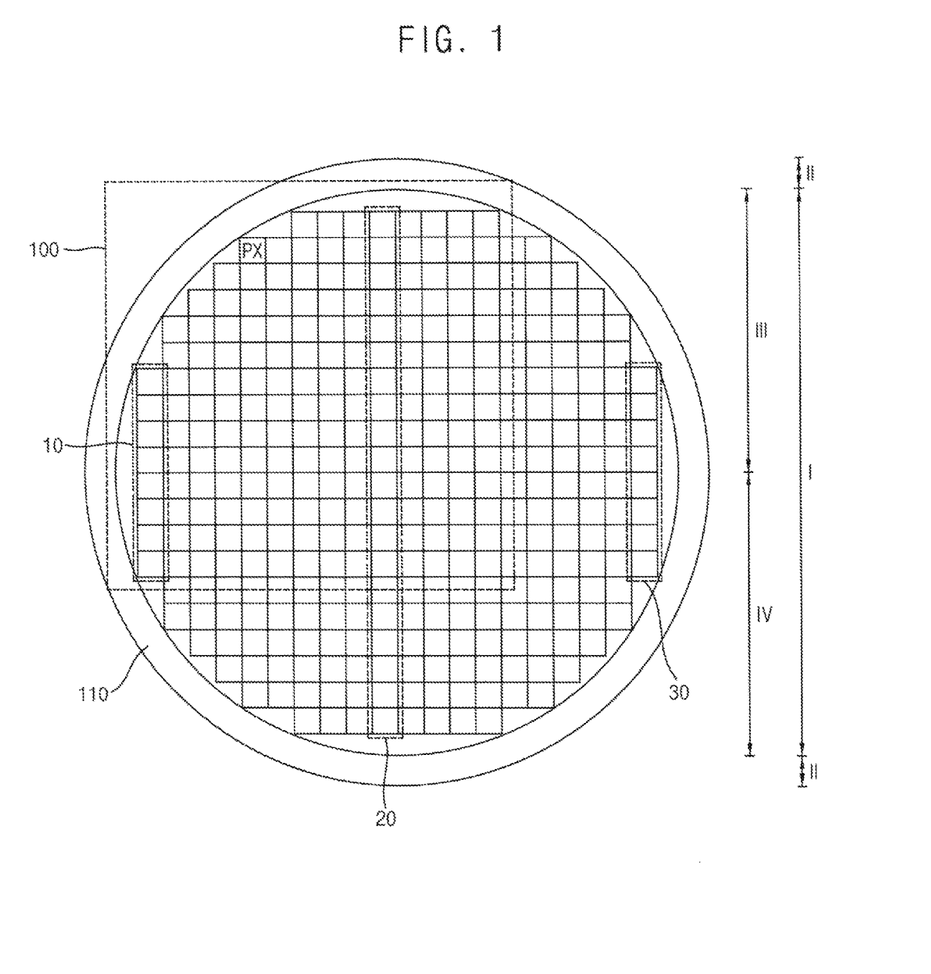
FIG. 1 is a planar view for describing a pixel region and a peripheral region.

FIG. 1 is a planar view for describing a pixel region and a peripheral region.

Referring to FIG. 1, an organic light-emitting diode (OLED) display can include a pixel region I and a peripheral region II. A plurality of pixels PX can be arranged in the pixel region I. Here, first through (N)th pixel columns can be located in the pixel region I, where N is an integer greater than 1. For example, the first pixel column 10 is located in a first side of the pixel region I (e.g., the left of the pixel region I), and the (N)th pixel column 30 is located in a second side of the pixel region I (e.g., the right of the pixel region I). In addition, a center pixel column 20 can be located between the first pixel column 10 and the (N)th pixel column 30 (e.g., the center of the pixel region I). The pixels PX can be arranged along each of the pixel columns. In example embodiments, the number of the pixels PX that is located in the pixel column increases in a direction from the first pixel column 10 and (N)th pixel column 30 to the center pixel column 20. For example, the first pixel column 10 and the (N)th pixel column 30 has the minimum number of the pixels PX, and the center pixel column 20 has the maximum number of the pixels PX. Here, the number of the pixels PX can be an integer greater than 2. In addition, pixel columns that are located adjacent to the center pixel column 20 can have the maximum number of the pixels PX. As a result, the pixels PX can be arranged as a planar shape of a circle, an ellipse, or a track-shape in the pixel region I, and the peripheral region II that surrounds the pixel region I can have a planar shape of a circle, an ellipse, or a track-shape. The pixel region I can have a first region III and a second region IV that is opposite to the first region III. The first region III and the second region IV can have a planar shape of a half circle, and can be symmetric to each other. In addition, an arrangement of the pixels PX can be symmetrical with respect to a boundary of the first region III and the second region IV.

The peripheral region II can surround the pixel region I. For example, the peripheral region II is planar having a substantially circular shape, substantially elliptical shape, or a track-shape. A plurality of lighting test transistors can be formed in the peripheral region II. In example embodiments, the lighting test transistors are formed in the peripheral region II adjacent to the first region III. The lighting test transistors that are formed in the peripheral region II can be formed of first through (N)th lighting test transistors, where N is integer greater than 1. Each of the first through (N)th lighting test transistors can be coupled to the first through (N)th pixel columns, respectively. For example, the first lighting test transistor are formed adjacent to the first pixel column 10, and are directly coupled to the first pixel of the first pixel column 10. Here, the first pixel of the first pixel column 10 can be electrically connected to the pixels PX that are formed along the first pixel column 10. Thus, the first lighting test transistor can perform a lighting test of the pixels PX that are formed in the first pixel column 10. Similarly, the (N)th lighting test transistor can be formed adjacent to the (N)th pixel column 30, and can be directly coupled to the first pixel of the (N)th pixel column 30. Here, the first pixel of the (N)th pixel column 30 can be electrically connected to the pixels PX that are formed along the (N)th pixel column 30. Thus, the (N)th lighting test transistor can perform a lighting test of the pixels PX that are formed in the (N)th pixel column 30.

The pixel region I and the peripheral region II can be located on a substrate 110. As the pixel region I and the peripheral region II have a substantially circular shape, the substrate 110 can have a substantially circular shape. Since the pixel region I has a planar shape of substantially a circle, the OLED display can be a circular display device.

Figure 2:
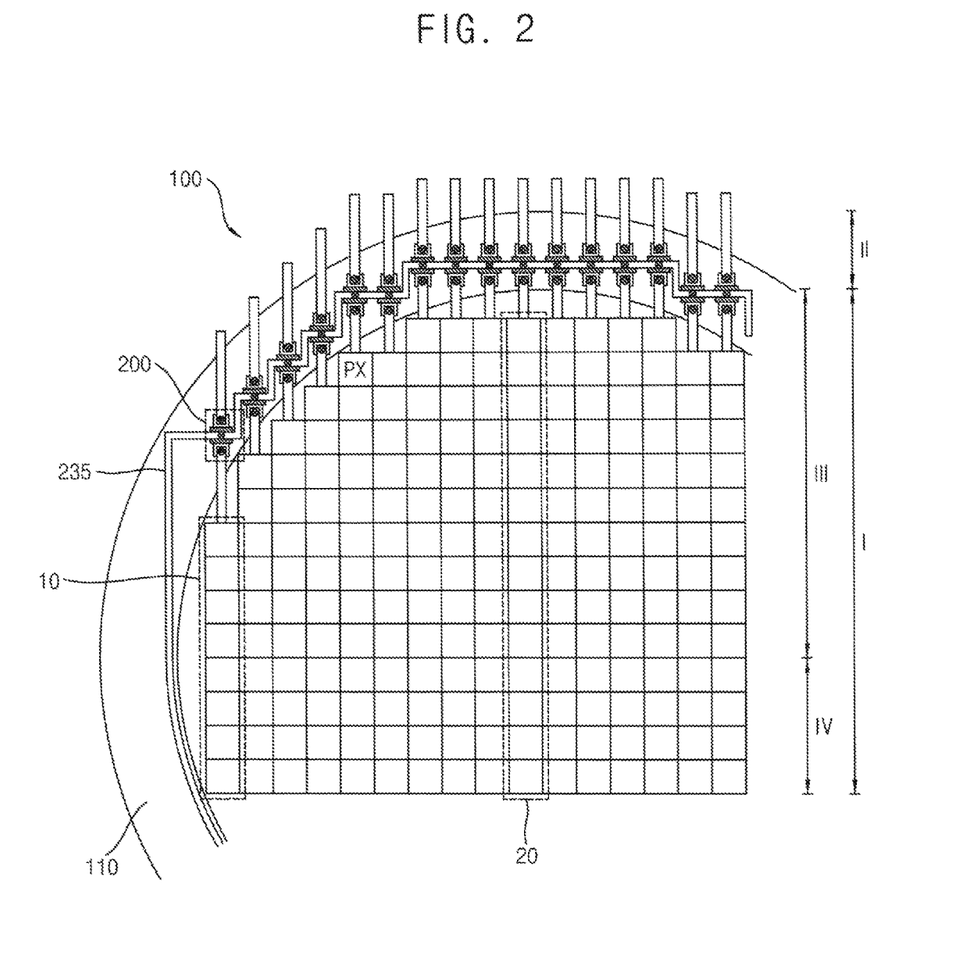
FIG. 2 is a planar view illustrating an OLED display in accordance with example embodiments.

FIG. 2 is a planar view illustrating an OLED display in accordance with example embodiments. Here, FIG. 2 is a partially enlarged view illustrating an area 100 of FIG. 1. In FIG. 2, detailed descriptions for elements, which are substantially the same as or similar to the elements described with reference to FIG. 1, will be omitted.

Referring to FIG. 2, an OLED display 100 includes a substrate 110, a gate insulation layer, an insulating interlayer, a plurality of lighting test transistors, a plurality of pixels PX, a planarization layer, etc.

The substrate 110 can have a pixel region I and a peripheral region II. Here, the pixel region I can have a first region III and a second region IV. The pixels PX can be arranged in the pixel region I, and the lighting test transistors can be formed in the peripheral region II adjacent to the first region III. Here, each of the pixels PX can include semiconductor elements, a lower electrode, a light-emitting layer, an upper electrode, etc., and each of the lighting test transistors can include a first active layer pattern, a first gate electrode, a conductive pattern 235, a first electrode, a second electrode, etc. In addition, each of the semiconductor elements can include a second active layer pattern, a second gate electrode, a source electrode, a drain electrode, etc.

In each of the lighting test transistors, the first active layer pattern can be formed on the substrate 110. The gate insulation layer (not shown) can be formed on the first active layer pattern. The first gate electrode can be formed on the gate insulation layer, and can overlap the active layer pattern. The first gate electrodes can be spaced apart from each other, and can have substantially the same shape (or size) to each other.

For example, when the lighting test transistors do not have gate electrodes having substantially the same shape to each other, each of the lighting test transistors has a different antenna ratio. Here, the antenna ratio is defined as a surface area ratio of a metal (e.g., a gate electrode) exposed by a plasma during a process using the plasma (e.g., a plasma etching process, a plasma ashing process, and a plasma deposition process). Thus, a typical lighting test transistor can include a gate electrode having a stepped shape. Since the substantially lighting test transistor includes gate electrodes having a different size (or area) to each other, each of the substantially lighting test transistors can have a different antenna ratio, and thus, luminance and accuracy of a lighting test of the typical OLED display can be reduced.

The insulating interlayer (not shown) can be formed on the first gate electrode. The first electrode, the second electrode, and the conductive pattern 235 can be formed on the insulating interlayer. A light-emitting signal of the pixels PX can be provided to the first electrode, and the light-emitting signal can be applied to the pixels PX through the second electrode. The conductive pattern 235 can be electrically connected to the first gate electrode. In addition, the conductive pattern 235 can be integrally formed.

In the peripheral region II adjacent to the second region IV, the conductive pattern 235 can extend along the outer portion of the pixel region I. In the peripheral region II adjacent to the first region III, the conductive pattern 235 can have a stepped structure (or stepped shape). The stepped structure can include a first extension portion and a second extension portion. The first extension portion can be substantially parallel to the first direction, and the second extension portion can extend in a second direction that crosses or is substantially perpendicular to the first direction. The first extension portion and the second extension portion can be alternately and repeatedly formed in the peripheral region II adjacent to the first region III. The first gate electrode can be formed in a portion under which the second extension portion is located. The conductive pattern 235 can receive a gate signal through pads (not shown) that is formed in both side portions of the second region IV. For example, the gate signal is provided in a clockwise direction through the conductive pattern 235 in a first side of the second region IV. In this case, the gate signal can be applied from the first pixel column 10 to center pixel column 20. Similarly, the gate signal can be provided in a counter-clockwise direction through the conductive pattern 235 in a second side of the second region IV. In this case, the gate signal can be applied from the (N)th pixel column 30 to center pixel column 20.

According to at least one of the disclosed embodiments, the OLED display 100 can increase the uniformity of the luminance and accuracy of the lighting test because the first gate electrodes having substantially the same shape are formed in the lighting test transistors, respectively.

Figure 3:
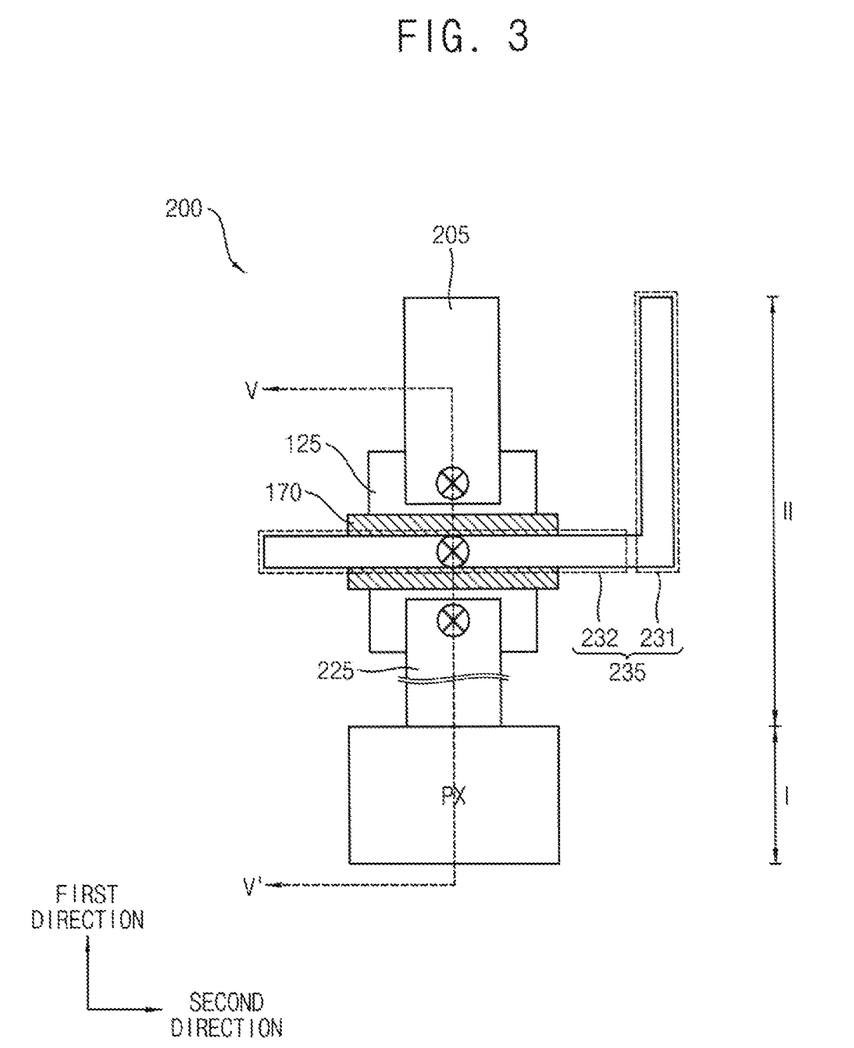
FIG. 3 is planar view for describing a lighting test transistor included in the OLED display of FIG. 2.

FIG. 3 is planar view for describing a lighting test transistor included in the OLED display of FIG. 2. Here, FIG. 3 is a partially enlarged view illustrating a first lighting test transistor 200 of FIG. 2. In FIG. 3, detailed descriptions for elements, which are substantially the same as or similar to the elements described with reference to FIG. 1, will be omitted.

Referring to FIG. 3, a first lighting test transistor 200 according to example embodiments includes a first active layer pattern 125, a gate insulation layer (not shown), a first gate electrode 170, an insulating interlayer (not shown), a conductive pattern 235, a first electrode 205, a second electrode 225, etc.

The first active layer pattern 125 can be formed on the substrate. In example embodiments, the first active layer pattern 125 has a source region, a drain region, and a channel region. The gate insulation layer can cover the first active layer pattern 125. The first gate electrode 170 can overlap the first active layer pattern 125 on the gate insulation layer. The insulating interlayer can cover the first gate electrode 170. The insulating interlayer can have a first opening, a second opening, and a third opening. The first opening can expose the source region of the first active layer pattern 125, and the second opening can expose the drain region of the first active layer pattern 125. In addition, the third opening can expose a portion of the first gate electrode 170. The first electrode 205, the conductive pattern 235, and the second electrode 225 can be formed on the insulating interlayer. The first electrode 205 can be in contact with the source region of the first active layer pattern 125 through the first opening. The second electrode 225 can be in contact with the drain region of the first active layer pattern 125 through the second opening. The conductive pattern 235 can be in contact with the first gate electrode 170 through the third opening. Here, the conductive pattern 235 can have a first extension portion 231 and a second extension portion 232. The first gate electrode 170 can be formed on a portion under which the second extension portion 232 is located. When a gate signal is applied, a light-emitting signal of the pixel PX applied in the source region of the first active layer pattern 125 through the first electrode 205 can be applied to the pixel PX through the channel and drain regions of the first active layer pattern 125 and the second electrode 225. Accordingly, the lighting test of the OLED display 100 can be performed.

Figure 4:
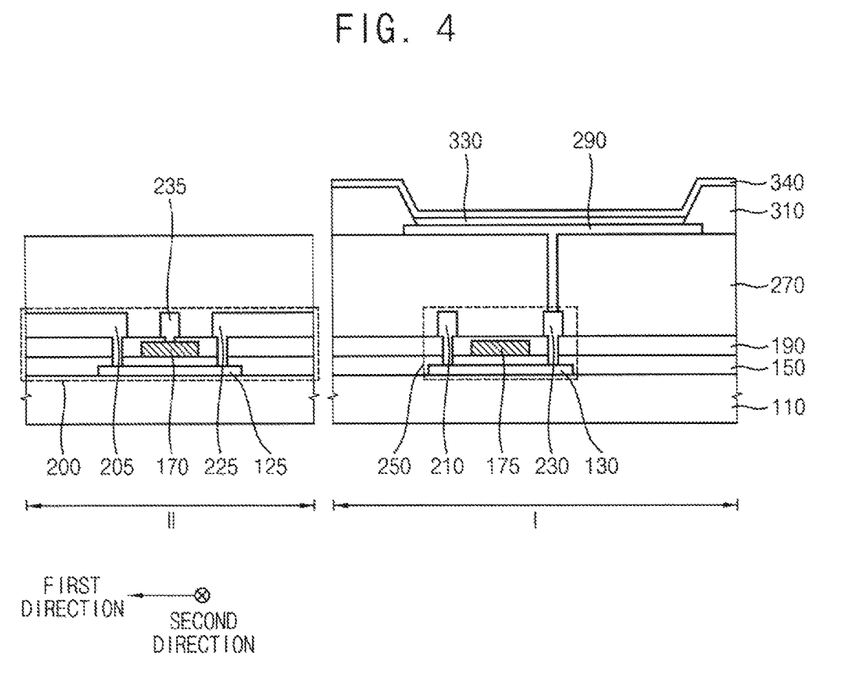
FIG. 4 is cross-sectional view illustrating the OLED display taken along a line V-V' of FIG. 3.

FIG. 4 is cross-sectional view illustrating the OLED display taken along a line V-V' of FIG. 3.

Referring to FIG. 4, an OLED display includes a substrate 110, a gate insulation layer 150, a insulating interlayer 190, a first lighting test transistor 200, a planarization layer 270, a pixel, a pixel defining layer 310, etc. Here, the first lighting test transistor 200 can include a first active layer pattern 125, a first gate electrode 170, a conductive pattern 235, a second electrode 225, etc. In addition, the pixel can include a semiconductor element 250, a lower electrode 290, a light-emitting layer 330, an upper electrode 340, etc. The semiconductor element 250 can include a second active layer pattern 130, a second gate electrode 175, a source electrode 210, and a drain electrode 230.

As described above, the OLED display can have a pixel region I and a peripheral region II of a substantially circular shape. For example, a display image is displayed in the pixel region I, and a plurality of lighting test transistors are formed in the peripheral region II. As the pixel region I has a substantially circular shape, the OLED display can serve as a substantially circular display device.

The first lighting test transistor 200 and the semiconductor element 250 can be formed on the substrate 110. The substrate 110 can be formed of transparent materials. For example, the substrate 110 is formed of one or more of quartz, synthetic quartz, calcium fluoride, fluoride-doping quartz, a sodalime glass, a non-alkali glass etc. Alternatively, the substrate 110 can be formed of a flexible transparent resin substrate. Here, the flexible transparent resin substrate for the substrate 110 can include a polyimide substrate. For example, the polyimide substrate can include a first polyimide layer, a barrier film layer, a second polyimide layer, etc. When the polyimide substrate is thin and flexible, the polyimide substrate can be formed on a rigid glass substrate to help support the formation of the light-emitting structure (e.g., the first lighting test transistor 200 and the semiconductor element 250, the lower electrode 290, the light-emitting layer 330, the upper electrode 340, etc.). That is, in example embodiments, the substrate 110 can have a structure in which the first polyimide layer, the barrier film layer and the second polyimide layer are stacked on a glass substrate. Here, after an insulation layer is provided on the second polyimide layer, the light-emitting structure can be formed on the insulation layer. After the light-emitting structure is formed on the insulation layer, the glass substrate can be removed. It can be difficult that the light-emitting structure is directly formed on the polyimide substrate because the polyimide substrate is thin and flexible. Accordingly, the light-emitting structure is formed on a rigid glass substrate, and then the polyimide substrate can serve as the substrate 110 after the removal of the glass substrate. As the OLED display includes the pixel region I and the peripheral region II, the substrate 110 can also include the pixel region I and the peripheral region II.

A buffer layer (not shown) can be formed on the substrate 110. The buffer layer can extend a first direction from the pixel region I into the peripheral region II. The buffer layer can prevent the diffusion (e.g., an out gassing) of metal atoms and/or impurities from the substrate 110. Additionally, the buffer layer can control a rate of a heat transfer in a crystallization process for forming the first active layer pattern 125 and the second active layer pattern 130, thereby obtaining substantially uniform the first active layer pattern 125 and the second active layer pattern 130. Furthermore, the buffer layer can improve a surface flatness of the substrate 110 when a surface of the substrate 110 is relatively irregular. According to a type of the substrate 110, at least two buffer layers can be provided on the substrate 110, or the buffer layer, in some embodiments, is not formed.

The first active layer pattern 125 and the second active layer pattern 130 can be spaced apart from each other by a predetermined distance on the substrate 110, and can be formed of one or more of an oxide semiconductor, an inorganic semiconductor (e.g., amorphous silicon, polysilicon, etc.), an organic semiconductor, etc. In example embodiments, the first active layer pattern 125 and the second active layer pattern 130 are formed of a semiconductor oxide including one or more of a binary compound (ABx), a ternary compound (ABxCy), a quaternary compound (ABxCyDz), etc. which contain indium, zinc, gallium, tin, titanium, aluminum, hafnium (Hf), zirconium (Zr), magnesium (Mg), etc. These compounds can be used alone or in combination thereof. For example, the first active layer pattern 125 and the second active layer pattern 130 are formed of one or more of zinc oxide (ZnOx), gallium oxide (GaOx), titanium oxide (TiOx), tin oxide (SnOx), indium oxide (InOx), indium-gallium oxide (IGO), indium-zinc oxide (IZO), indium tin oxide (ITO), gallium zinc oxide (GZO), zinc magnesium oxide (ZMO), zinc tin oxide (ZTO), zinc zirconium oxide (ZnZrxOy), indium-gallium-zinc oxide (IGZO), indium-zinc-tin oxide (IZTO), indium-gallium-hafnium oxide (IGHO), tin-aluminum-zinc oxide (TAZO), indium-gallium-tin oxide (IGTO), etc.

The gate insulation layer 150 can be formed on the first active layer pattern 125 and the second active layer pattern 130. The gate insulation layer 150 can cover the first active layer pattern 125 and the second active layer pattern 130 in the pixel region I and the peripheral region II, and can extend in the first direction on the substrate 110. That is, the gate insulation layer 150 can be formed on the entire substrate 110. The gate insulation layer 150 can be formed of one or more of a silicon compound, a metal oxide, etc.

The first gate electrode 170 can be formed on a portion of the gate insulation layer 150 under which the first active layer pattern 125 is located. In addition, the second gate electrode 175 can be formed on a portion of the gate insulation layer 150 under which the second active layer pattern 130 is located. Each of a plurality of the first gate electrodes 170 included in the OLED display can have substantially the same shape. Each of the first gate electrode 170 and the second gate electrode 175 can be formed of one or more of a metal, an alloy, metal nitride, conductive metal oxide, transparent conductive materials, etc. For example, each of the first gate electrode 170 and the second gate electrode 175 is formed of one or more of aluminum (Al), an alloy containing aluminum, aluminum nitride (AlNx), silver (Ag), an alloy containing silver, tungsten (W), tungsten nitride (WNx), copper (Cu), an alloy containing copper, nickel (Ni), chrome (Cr), molybdenum (Mo), an alloy containing molybdenum, titanium (Ti), titanium nitride (TiNx), platinum (Pt), tantalum (Ta), tantalum nitride (TaNx), neodymium (Nd), scandium (Sc), strontium ruthenium oxide (SrRuxOy), zinc oxide (ZnOx), indium tin oxide (ITO), tin oxide (SnOx), gallium oxide (GaOx), indium zinc Oxide (IZO), etc. These can be used alone or in a suitable combination thereof.

The insulating interlayer 190 can be formed on the first gate electrode 170 and the second gate electrode 175. The insulating interlayer 190 can cover the first gate electrode 170 and the second gate electrode 175 in the pixel region I and the peripheral region II, and can extend in the first direction on the substrate 110. That is, the insulating interlayer 190 can be formed on the entire substrate 110. The insulating interlayer 190 can be formed of one or more of a silicon compound, a metal oxide, etc.

The first electrode 205, the second electrode 225, the conductive pattern 235, the source electrode 210, and the drain electrode 230 can be formed on the insulating interlayer 190. Each of the first and second electrodes 205 and 225 can be in contact with each of source and drain regions of the first active layer pattern 125 by removing each of first and second portions of the gate insulation layer 150 and the insulating interlayer 190. The source and drain electrodes 210 and 230 can be in contact with source and drain regions of the second active layer pattern 130 by removing each of third and fourth portions of the gate insulation layer 150 and the insulating interlayer 190. In addition, the conductive pattern 235 can be in contact with the first gate electrode 170 by removing a portion of the insulating interlayer 190. The conductive pattern 235 can extend along the outer portion of the pixel region I. The conductive pattern 235 can have a stepped shape. The stepped structure can include a first extension portion and a second extension portion. The first extension portion can be substantially parallel in the first direction, and the second extension portion can extend in a second direction that crosses or is substantially perpendicular to the first direction. The first extension portion and the second extension portion can be alternately and repeatedly formed in the peripheral region II. The first gate electrode 170 can be formed in a portion under which the second extension portion is located. The conductive pattern 235 can receive a gate signal through pads that is formed in both side portions of the second region IV. Thus, the conductive pattern 235 can provide the gate signal to the first gate electrode 170. When the gate signal is applied to the first gate electrode 170, a light-emitting signal of the pixel PX applied in the source region of the first active layer pattern 125 through the first electrode 205 can be applied to the pixel PX through the channel and drain regions of the first active layer pattern 125 and the second electrode 225. Each of the first electrode 205, the second electrode 225, the conductive pattern 235, the source electrode 210, and the drain electrode 230 can be formed of one or more of a metal, an alloy, metal nitride, conductive metal oxide, transparent conductive materials, etc. For example, each of the first electrode 205, the second electrode 225, the conductive pattern 235, the source electrode 210, and the drain electrode 230 is formed of one or more of Al, Cu, Mo, Ti, Cr, Ta, W, Nd, Sc, alloys thereof, SrRuxOy, ITO, GaOx, IZO, ZnOx, SnOx, carbon nanotube, etc.

The planarization layer 270 can be formed on the first electrode 205, the second electrode 225, the conductive pattern 235, the source electrode 210, and the drain electrode 230. The planarization layer 270 can cover the first electrode 205, the second electrode 225, the conductive pattern 235, the source electrode 210, and the drain electrode 230 in the pixel region I and the peripheral region II, and can extend in the first direction on the substrate 110. That is, the planarization layer 270 can be formed on the entire substrate 110. The planarization layer 270 can be formed of one or more of a silicon compound, a metal oxide, etc.

The lower electrode 290 can be formed in the pixel region I on the planarization layer 270. The lower electrode 290 can be in contact with the drain electrode 230 by removing a portion of the planarization layer 270. In addition, the lower electrode 290 can be electrically connected to the semiconductor element 250. The lower electrode 290 can be formed of one or more of a metal, an alloy, metal nitride, conductive metal oxide, transparent conductive materials, etc.

The pixel defining layer 310 can be formed on the planarization layer 270 to expose a portion of the lower electrode 290. The pixel defining layer 310 can be formed of organic materials or inorganic materials. In this case, the light-emitting layer 330 can be formed on a portion that the lower electrode 290 is exposed by the pixel defining layer 310.

The light-emitting layer 330 can be formed on the exposed lower electrode 290. The light-emitting layer 330 can be formed using light-emitting materials that can generate different colors of light (e.g., a red color of light, a blue color of light, and a green color of light).

The upper electrode 340 can be formed on the pixel defining layer 310 and the light-emitting layer 330. The upper electrode 340 can cover the pixel defining layer 310 and the light-emitting layer 330 in the pixel region I, and can extend in the first direction on the substrate 110. The upper electrode 340 can be formed of one or more of a metal, an alloy, metal nitride, conductive metal oxide, a transparent conductive material, etc. These can be used alone or in a combination thereof.

In the OLED display according to example embodiments, the first gate electrodes 170 having the same shape can be formed in each of the lighting test transistors. Accordingly, uniformity of the luminance and accuracy of the lighting test for the OLED display can be increased. In addition, the first gate electrode 170 and the second gate electrode 175 can be substantially simultaneously or concurrently formed, and the conductive pattern 235, the first electrode 205, the second electrode 225, source electrode 210, and the drain electrode 230 can be substantially simultaneously or concurrently formed. Accordingly, manufacturing cost of the OLED display is not significantly increased.

FIGS. 5 through 9 are cross-sectional views illustrating a method of manufacturing an OLED display in accordance with example embodiments.

Figure 5:
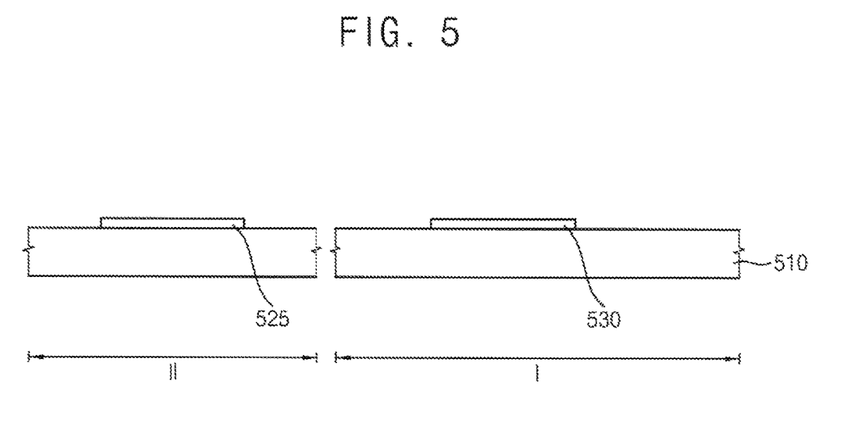
FIGS. 5 through 9 are cross-sectional views illustrating a method of manufacturing an OLED display in accordance with example embodiments.

Referring to FIG. 5, a first active layer pattern 525 and a second active layer pattern 530 are formed in a peripheral region II and a pixel region I on a substrate 510, respectively. The substrate 510 can be formed of one or more of quartz, synthetic quartz, calcium fluoride, fluoride-doping quartz, a sodalime glass, a non-alkali glass etc. Alternatively, a buffer layer can be formed on the substrate 510. The buffer layer can extend in a first direction from the pixel region I into the peripheral region II. The buffer layer can be formed in the entire substrate 510, and can prevent the diffusion of metal atoms and/or impurities from the substrate 510. Each of the first active layer pattern 525 and the second active layer pattern 530 can be formed using one or more of an oxide semiconductor, an inorganic semiconductor, an organic semiconductor, etc. In example embodiments, the first active layer pattern 525 and the second active layer pattern 530 are formed of a semiconductor oxide including one or more of In, Zn, Ga, Sn, Ti, Al, Hf, Zr, Mg, etc. For example, the first active layer pattern 525 and the second active layer pattern 530 are formed using one or more of ZnOx, GaOx, TiOx, SnOx, InOx, IGO, IZO, ITO, GZO, ZMO, ZTO, ZnZrxOy, IGZO, IZTO, IGHO, TAZO, IGTO, etc. That is, the first active layer pattern 525 and the second active layer pattern 530 can be substantially simultaneously or concurrently formed using the same materials.

Figure 6:
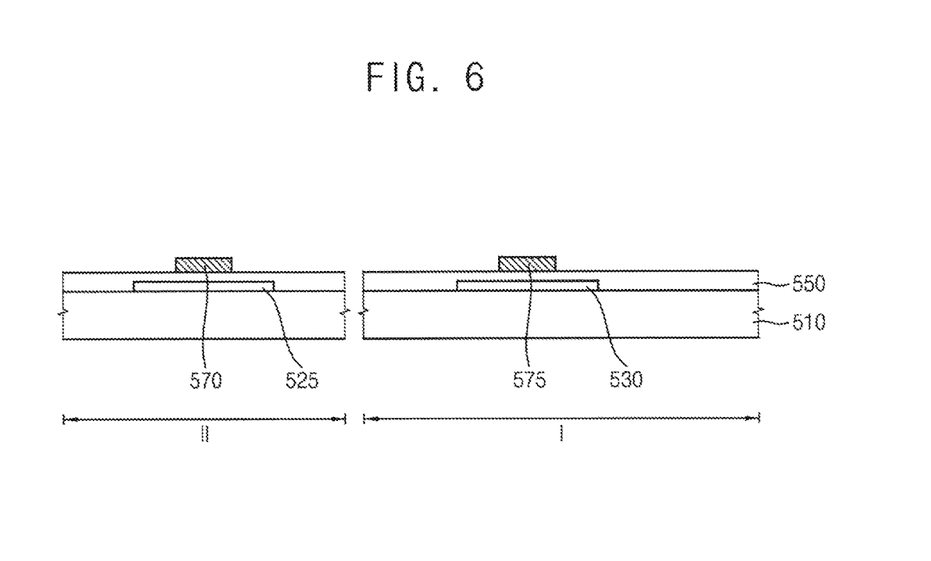

Referring to FIG. 6, a gate insulation layer 550 is formed on the substrate 510. The gate insulation layer 550 can cover the first active layer pattern 525 and the second active layer pattern 530, and can extend in the first direction on the substrate 510. That is, the gate insulation layer 550 can be formed in the pixel region I and the peripheral region II on the entire substrate 510. The gate insulation layer 550 can be formed using one or more of a silicon compound, a metal oxide, etc. The first gate electrode 570 can be formed on a portion of the gate insulation layer 550 under which the first active layer pattern 525 is located. In addition, the second gate electrode 575 can be formed on a portion of the gate insulation layer 550 under which the second active layer pattern 530 is located. Here, a plurality of the first gate electrodes 570 included in an OLED display can have substantially the same shape (or size) to each other. Each of the first gate electrode 570 and the second gate electrode 575 can be formed using one or more of a metal, an alloy, metal nitride, conductive metal oxide, transparent conductive materials, etc. For example, the first gate electrode 570 and the second gate electrode 575 are formed using one or more of Al, an alloy containing aluminum, AlNx, Ag, an alloy containing silver, W, WNx, Cu, an alloy containing copper, Ni, Cr, Mo, an alloy containing molybdenum, Ti, TiNx, Pt, Ta, TaNx, Nd, Sc, SrRuxOy, ZnOx, ITO, SnOx, GaOx, IZO, etc. That is, the first gate electrode 570 and the second gate electrode 575 can be substantially simultaneously or concurrently formed using the same materials.

Figure 7:
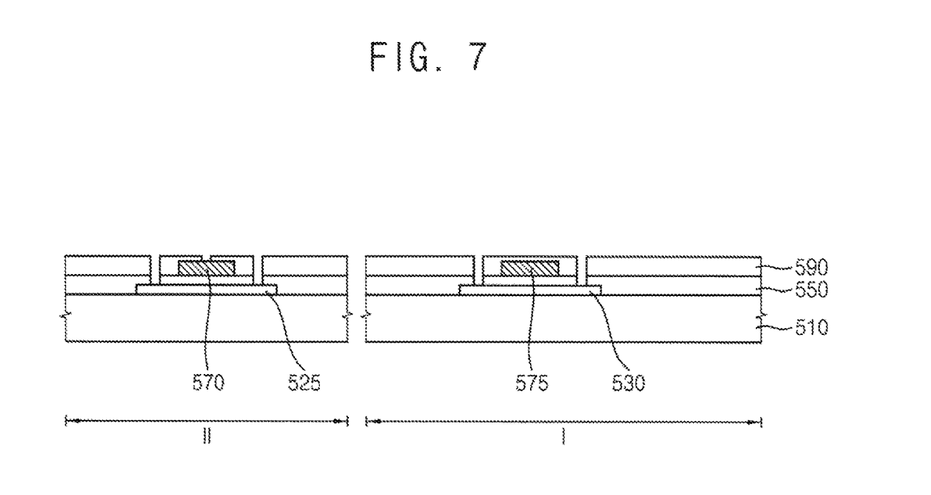

Referring to FIG. 7, an insulating interlayer 590 is formed on the first gate electrode 570 and the second gate electrode 575. The insulating interlayer 590 can cover the first gate electrode 570 and the second gate electrode 575, and can extend in the first direction on the gate insulation layer 550. That is, the insulating interlayer 590 can be formed in the pixel region I and the peripheral region II on the entire substrate 110. After the insulating interlayer 590 is formed, a first opening that exposes a source region of the first active layer pattern 525, a second opening that exposes a drain region of the first active layer pattern 525, a third opening that exposes a portion of the first gate electrode 570, a fourth opening that exposes a first region of the second active layer pattern 575, and a fifth opening that exposes a second region of the second active layer pattern 575 can be formed. The insulating interlayer 590 can be formed using one or more of a silicon compound, a metal oxide, etc.

Figure 8:
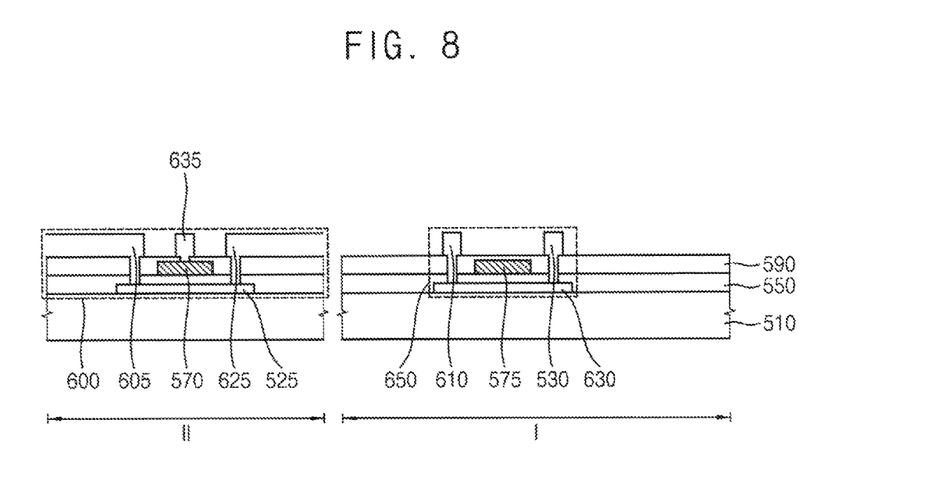

Referring to FIG. 8, a first electrode 605, a second electrode 625, a conductive pattern 635, a source electrode 610, and a drain electrode 630 are formed on the insulating interlayer 590. The first and second electrodes 205 and 225 can be in contact with source and drain regions of the first active layer pattern 525 by removing first and second portions of the gate insulation layer 550 and the insulating interlayer 590. The source and drain electrodes 610 and 630 can be in contact with source and drain regions of the second active layer pattern 530 by removing third and fourth portions of the gate insulation layer 550 and the insulating interlayer 590. In addition, the conductive pattern 635 can be in contact with the first gate electrode 570 by removing a portion of the insulating interlayer 590. The conductive pattern 635 can extend along the outer portion of the pixel region I. The conductive pattern 635 can have a stepped shape. The stepped structure can include a first extension portion and a second extension portion. The first extension portion can be substantially parallel to the first direction, and the second extension portion can extend in a second direction that crosses or is substantially perpendicular to the first direction. The first extension portion and the second extension portion can be alternately and repeatedly formed in the peripheral region II. The first gate electrode 570 can be formed in a portion under which the second extension portion is located. Each of the first electrode 605, the second electrode 625, the conductive pattern 635, the source electrode 610, and the drain electrode 630 can be formed using one or more of a metal, an alloy, metal nitride, conductive metal oxide, transparent conductive materials, etc. For example, each of the first electrode 605, the second electrode 625, the conductive pattern 635, the source electrode 610, and the drain electrode 630 can be formed using one or more of Al, Cu, Mo, Ti, Cr, Ta, W, Nd, Sc, alloys thereof, SrRuxOy, ITO, GaOx, IZO, ZnOx, SnOx, carbon nanotube, etc. That is, the first electrode 605, the second electrode 625, the conductive pattern 635, the source electrode 610, and the drain electrode 630 can be substantially simultaneously or concurrently formed using the same materials. Accordingly, a first lighting test transistor 600 having a first active layer pattern 525, first gate electrode 570, the first electrode 605, and the second electrode 625 can be formed, and a semiconductor element 650 having the second active layer pattern 530, the second gate electrode 575, the source electrode 210, and the drain electrode 630 can be formed.

Figure 9:
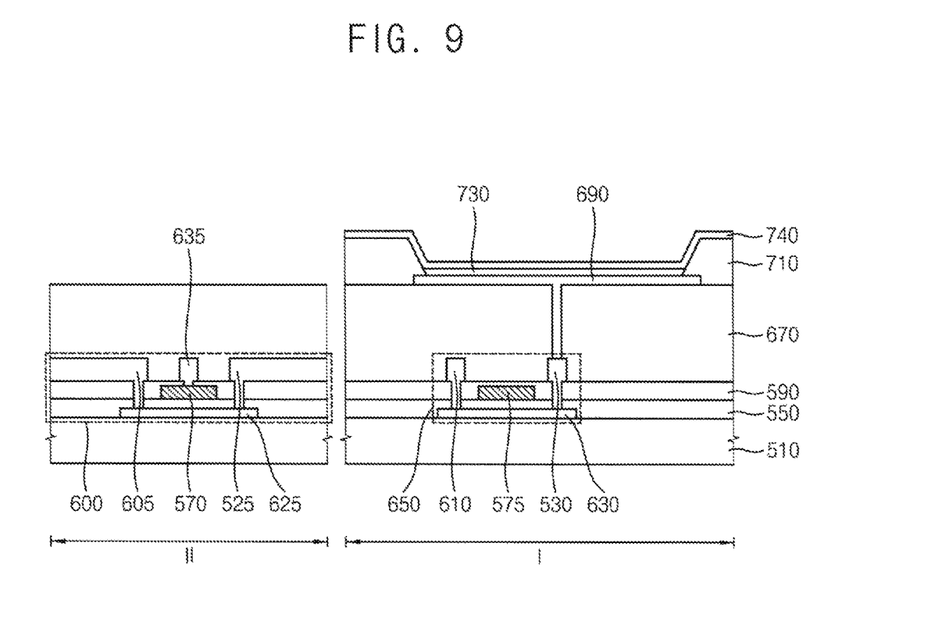

Referring to FIG. 9, a planarization layer 670 is formed on the insulating interlayer 590. The planarization layer 670 can cover the first electrode 605, the second electrode 625, the conductive pattern 635, the source electrode 610, and the drain electrode 630, and can extend in the first direction on the insulating interlayer 590. The planarization layer 670 can be formed in the pixel region I and the peripheral region II on the entire substrate 510. The planarization layer 670 can be formed using one or more of a silicon compound, a metal oxide, etc.

A lower electrode 690 can be formed in the pixel region I on the planarization layer 670. The lower electrode 690 can be in contact with the drain electrode 630 by removing a portion of the planarization layer 670. The lower electrode 690 can be formed using one or more of a metal, an alloy, metal nitride, conductive metal oxide, transparent conductive materials, etc.

A pixel defining layer 710 can be formed in the pixel region I on a portion of the planarization layer 670 and a portion of the lower electrode 690. The pixel defining layer 710 can be formed on the planarization layer 670 to expose a portion of the lower electrode 690. The pixel defining layer 710 can be formed using organic materials or inorganic materials.

A light-emitting layer 730 can be formed on the exposed lower electrode 690. The light-emitting layer 630 can be formed using light-emitting materials that can generate different colors of light (e.g., a red color of light, a blue color of light, and a green color of light).

An upper electrode 740 can be formed on the pixel defining layer 710 and the light-emitting layer 730. The upper electrode 740 can cover the pixel defining layer 710 and the light-emitting layer 730 in the pixel region I, and can extend in the first direction on the pixel defining layer 710 and the light-emitting layer 730. The upper electrode 740 can be formed using one or more of a metal, an alloy, metal nitride, conductive metal oxide, a transparent conductive material, etc. These can be used alone or in a combination thereof.

Figure 10:
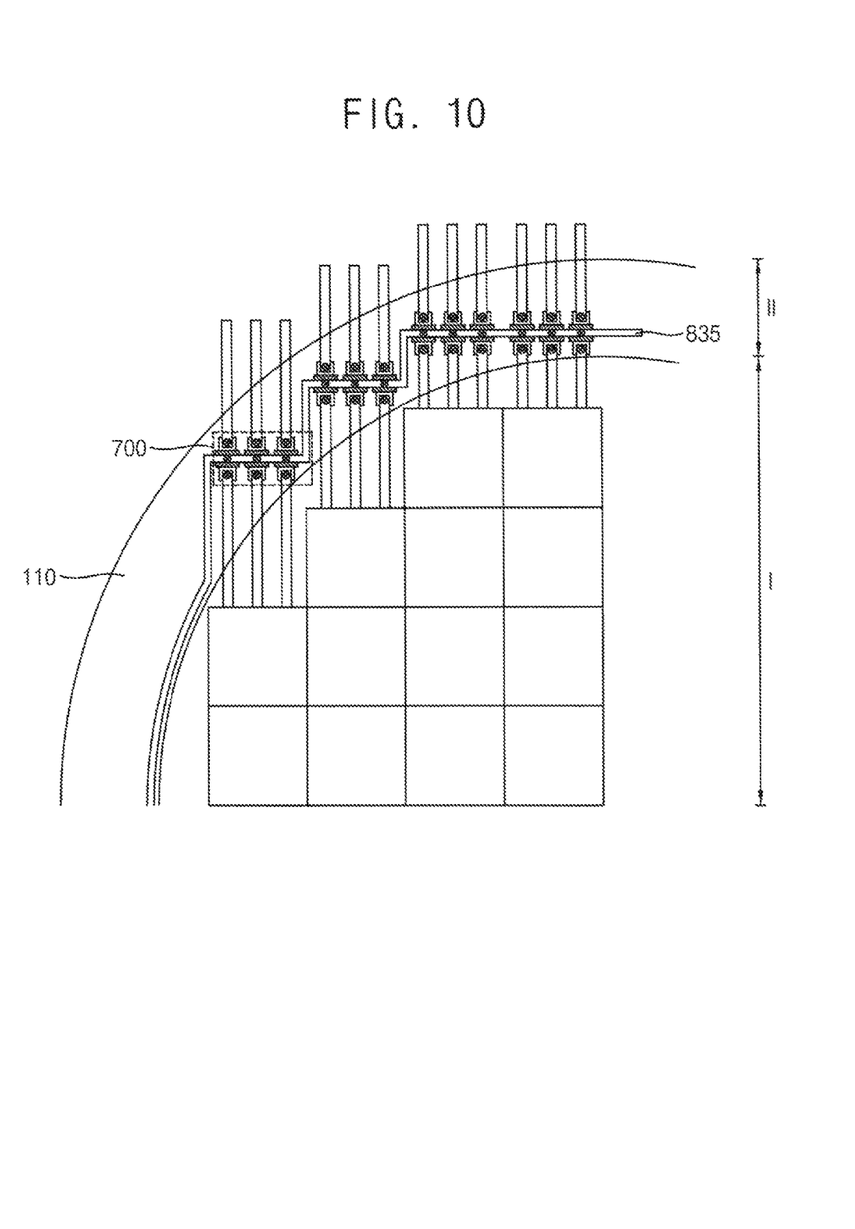
FIG. 10 is a planar view illustrating an OLED display in accordance with some example embodiments.

FIG. 10 is a planar view illustrating an OLED display in accordance with some example embodiments. An OLED display illustrated in FIG. 10 can have a configuration substantially the same as or similar to that of the OLED display 100 described with reference to FIG. 2. In FIG. 10, detailed descriptions for elements, which are substantially the same as or similar to the elements described with reference to FIG. 2, will be omitted.

Referring to FIG. 10, an OLED display can include a substrate 110, a gate insulation layer, an insulating interlayer, a plurality of lighting test transistors, a plurality of pixels PX, a planarization layer, etc.

The substrate 110 can have a pixel region I and a peripheral region II. The pixels PX can be arranged in the pixel region I, and the lighting test transistors can be formed in the peripheral region II. Here, each of the pixels PX can include semiconductor elements, a lower electrode, a light-emitting layer, an upper electrode, etc., and each of the lighting test transistors can include a first active layer pattern, a first gate electrode, a conductive pattern 835, a first electrode, a second electrode, etc. In addition, each of the semiconductor elements can include a second active layer pattern, a second gate electrode, a source electrode, a drain electrode, etc.

In example embodiments, one pixel PX includes first through third sub-pixels, and one lighting test transistor includes first through third sub-lighting test transistors. For example, the first sub-pixel emits light of a red color, and the second sub-pixel emits light of a green color. In addition, the third sub-pixel can emit light of a blue color. The first through third sub-lighting test transistors can be coupled to the first through third sub-pixels, respectively. Thus, a light-emitting signal of the red pixel can be controlled by the first sub-lighting test transistor, and a light-emitting signal of the green pixel can be controlled by the second sub-lighting test transistor. In addition, a light-emitting signal of the blue pixel can be controlled by the third sub-lighting test transistor. Here, the first through third sub-lighting test transistors can have one gate electrode. That is, the one gate electrode can be electrically connected to the first through third sub-lighting test transistors. The conductive pattern 835 can extend along the outer portion of the pixel region I. In the peripheral region II, the conductive pattern 835 can have a stepped structure (or stepped shape). The stepped structure can include a first extension portion and a second extension portion. The first extension portion can be substantially parallel to the first direction, and the second extension portion can extend in a second direction that crosses or is substantially perpendicular to the first direction. The first extension portion and the second extension portion can be alternately and repeatedly formed in the peripheral region II. The first gate electrode can be formed in a portion under which the second extension portion is located.

Figure 11:
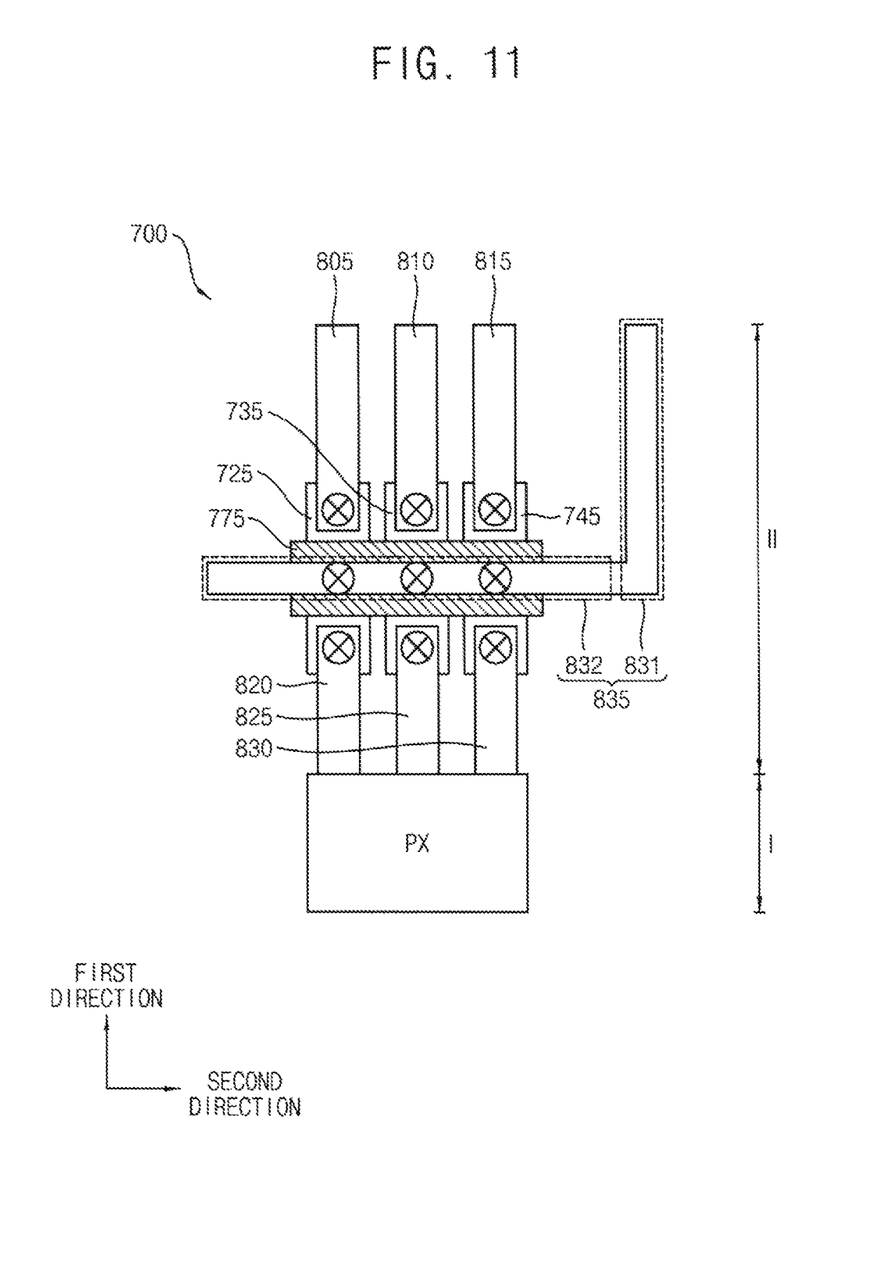
FIG. 11 is a planar view for describing a lighting test transistor included in the OLED display of FIG. 10.

FIG. 11 is a planar view for describing a lighting test transistor included in the OLED display of FIG. 10. Here, FIG. 11 is a partially enlarged view illustrating a first lighting test transistor 700 of FIG. 10. In FIG. 11, detailed descriptions for elements, which are substantially the same as or similar to the elements described with reference to FIG. 10, will be omitted.

Referring to FIG. 11, a first lighting test transistor 700 according to example embodiments includes first through third sub-lighting test transistors.

The first sub-lighting test transistor can include a first sub-active layer pattern 725, a first sub-source electrode 205, a first sub-drain electrode 820, etc. The second sub-lighting test transistor can include a second sub-active layer pattern 735, a second sub-source electrode 810, a second sub-drain electrode 825, etc.

The third sub-lighting test transistor can include a third sub-active layer pattern 745, a third sub-source electrode 815, a third sub-drain electrode 830, etc. The first gate electrode 775 can be formed to overlap the first sub-active layer pattern 725, the second sub-active layer pattern 735, and the third sub-active layer pattern 745. The conductive pattern 835 can be in contact with the first gate electrode 775. Here, the conductive pattern 835 can have a first extension portion 831 and a second extension portion 832. The first gate electrode 775 can be formed on a portion under which the second extension portion 832 is located.

The described technology can be applied to various display devices including a substantially circular OLED display. For example, the described technology can be applied to a vehicle, a ship, an aircraft, portable communication devices, display devices for information transfer, a medical-display devices, etc.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the inventive technology. Accordingly, all such modifications are intended to be included within the scope of the present inventive concept as defined in the claims. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. An organic light-emitting diode (OLED) display, comprising:
   a substrate including a pixel region including a plurality of pixels; and
   a plurality of lighting test transistors formed in a peripheral region surrounding the pixel region and electrically connected to the pixels, wherein the lighting test transistors are configured to test lighting of the pixels,
   wherein each of the lighting test transistors includes:
      a first active layer pattern formed over the substrate;
      a first gate electrode formed over the first active layer pattern; and
      a conductive pattern formed over the first gate electrodes, wherein the conductive pattern is electrically connected to the first gate electrode,
   wherein the first gate electrodes are spaced apart from each other and have substantially the same shape, and
   wherein the conductive patterns are integrally formed.

2. The OLED display of claim 1, wherein each of the pixels includes:
   a semiconductor element formed over the substrate;
   a lower electrode formed over the semiconductor element;
   a light-emitting layer formed over the lower electrode; and
   an upper electrode formed over the light-emitting layer.

3. The OLED display of claim 2, wherein the semiconductor element includes:
   a second active layer pattern formed over the substrate and including source and drain regions;
   a second gate electrode formed over the second active layer pattern;
   a source electrode contacting the source region of the second active layer pattern; and
   a drain electrode contacting the drain region of the second active layer pattern.

4. The OLED display of claim 3, further comprising:
   a gate insulation layer formed over the substrate, the first active layer pattern, and the second active layer pattern; and
   an insulating interlayer formed over the gate insulation layer, the first gate electrode, and the second gate electrode,
   wherein the insulating interlayer has an opening that exposes at least a portion of the first gate electrode, and
   wherein the conductive pattern contacts the first gate electrode via the opening.

5. The OLED display of claim 4, wherein the first active pattern includes source and drain regions, and wherein the OLED display further comprises:
   a first electrode formed over the insulating interlayer and contacting the source region of the first active layer pattern; and
   a second electrode formed over the insulating interlayer and contacting the drain region of the first active layer pattern,
   wherein the first electrode is configured to receive a light-emitting signal, and wherein the lighting test transistor is configured to provide a gate signal to the conductive pattern.

6. The OLED display of claim 5, wherein the first and second gate electrodes are formed of the same material, and wherein the first and second active layer patterns are formed of the same material.

7. The OLED display of claim 1, wherein the pixel region and the peripheral region are substantially circular, are substantially elliptical, or have a track-shape.

8. The OLED display of claim 1, wherein the pixel region includes first and second regions opposing each other, wherein the first and second regions have the shape of substantially a semi-circle, and wherein the pixels include a first group of pixels and a second group of pixels, and wherein the first and second groups are symmetrical to each other with respect to a boundary between the first and second regions.

9. The OLED display of claim 8, wherein the lighting test transistors are formed in the peripheral region adjacent to the first region.

10. The OLED display of claim 9, wherein the conductive pattern has a step shape in the peripheral region.

11. The OLED display of claim 10, wherein the step shape includes:
   a first extension portion formed in a first direction; and
   a second extension portion extending in a second direction crossing the first direction,
   wherein the first and second extension portions are alternately and repeatedly formed in the peripheral region, and
   wherein the first gate electrode is formed below the second extension portion.

12. The OLED display of claim 11, wherein the second extension portion is electrically connected to the first gate electrode.

13. The OLED display of claim 1, wherein the pixel region includes a plurality of pixel columns including first to (N)th pixel columns, where N is an integer greater than 1, and wherein the pixels are formed in the pixel columns.

14. The OLED display of claim 13, wherein the pixel region includes a center pixel column located between the first pixel column and the (N)th pixel column, and wherein the number of the pixels increases from the first to the center pixel column located in the center of the pixel region, and wherein the number of the pixels increases from the (N)th pixel columns to the center pixel column.

15. The OLED display of claim 14, wherein the center pixel column has the maximum number of the pixels among all of the pixel columns, and wherein each of the first and (N)th pixel columns has the minimum number of the pixels among all of the pixel columns, where the minimum number is an integer greater than 2.

16. The OLED display of claim 15, wherein one or more of the pixel columns located adjacent to the center pixel column have the maximum number of the pixels.

17. The OLED display of claim 13, wherein the lighting test transistors include first to (N)th lighting test transistors, and wherein the first to (N)th light test transistors are electrically connected to the first to (N)th pixel columns, respectively.

18. The OLED display of claim 17, wherein the pixels of the (K)th column are configured to be turned on when a (K)th lighting test transistor is on, where K is an integer between 1 and N.

19. The OLED display of claim 1, wherein each of the pixels includes first to third sub-pixels, and wherein each of the lighting test transistors includes first to third sub-lighting test transistors.

20. The OLED display of claim 19, wherein the first to third sub-lighting test transistors are electrically connected to the first to third sub-pixels, respectively.

* * * * *